Figure 1:
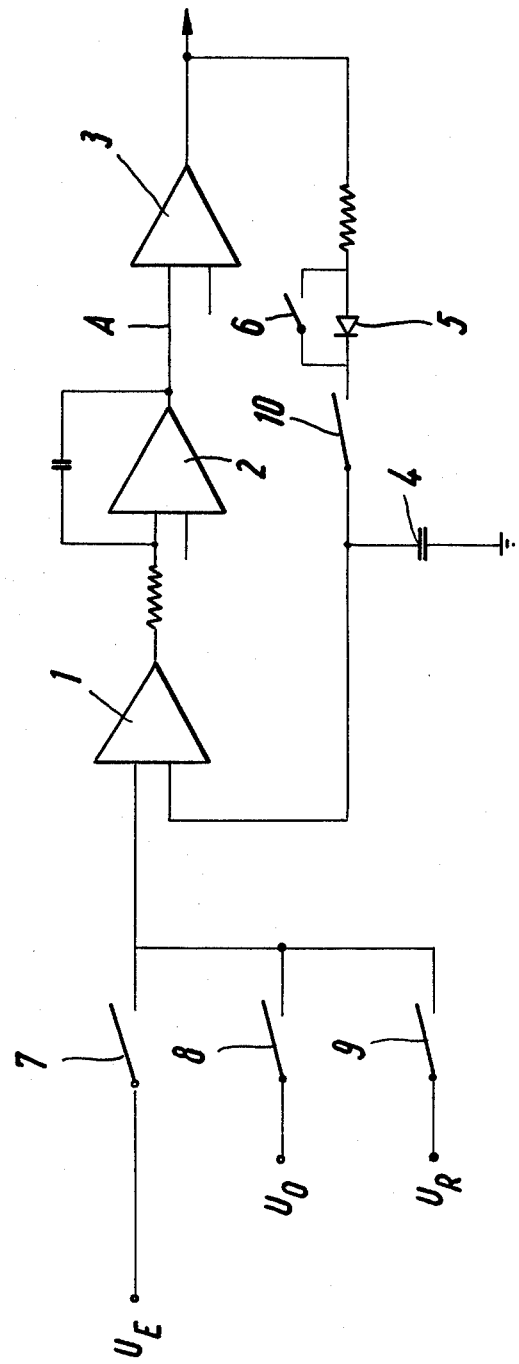

United States Patent [19]

Zschimmer

[11] 4,144,492

[45] Mar. 13, 1979

[54] METHOD FOR MEASURING A VOLTAGE WITH THE AID OF AN ANALOGUE-DIGITAL CONVERTER

[76] Inventor: Gero Zschimmer, Adelmannstrasse 5, 8000 Munich 82, Fed. Rep. of Germany

[21] Appl. No.: 844,431

[22] Filed: Oct. 21, 1977

Related U.S. Application Data

[63] Continuation of Ser. No. 668,697, Mar. 19, 1976, abandoned.

[30] Foreign Application Priority Data

Mar. 27, 1975 [DE] Fed. Rep. of Germany ....... 2514272

[51] Int. Cl.$^2$ ..................... G01R 19/16; H03K 5/20
[52] U.S. Cl. ..................... 324/103 P; 307/351; 324/111
[58] Field of Search ............... 324/103 P, 103 R, 111, 324/99 D, 102; 307/351; 340/347 AD

[56] References Cited

U.S. PATENT DOCUMENTS

| | | | |
|---|---|---|---|
| 3,396,336 | 8/1968 | Cropper | 324/103 R |
| 3,840,807 | 10/1974 | Zschimmer | 324/111 |
| 3,846,692 | 11/1974 | Hill | 324/103 P |

*Primary Examiner*—Palmer C. Demeo
*Assistant Examiner*—Ernest F. Karlsen
*Attorney, Agent, or Firm*—Parmelee, Johnson, Bollinger & Bramblett

[57] ABSTRACT

The invention provides a method of measuring a voltage with the aid of an analogue-digital converter comprising an integrator and a comparator, in which a first voltage maintaining the integrator on a certain reference potential, a second voltage, bringing the output of the integrator to a certain potential, and a third voltage, discharging the voltage at the output of the integrator are applied to the converter. In this method for measuring instantaneous values of measurement voltages, the first voltage is the measurement voltage and the second voltage is the auxiliary voltage.

4 Claims, 2 Drawing Figures

METHOD FOR MEASURING A VOLTAGE WITH THE AID OF AN ANALOGUE-DIGITAL CONVERTER

This is a continuation of application Ser. No. 668,697, filed Mar. 19, 1976, now abandoned.

The invention refers to a method of measuring a voltage with the aid of an analogue-digital converter comprising an integrator and a comparator. A first voltage maintaining the integrator on a certain reference potential, a second voltage, bringing the output of the integrator to a certain potential, and a third voltage, discharging the voltage at the output of the integrator, are applied to the converter.

In known methods of this kind (see German Pat. Specification 2 111 393, FIG. 3 = U.S. Patent Specification 3,840,807, FIG. 3) the first voltage applied is an auxiliary voltage and the second voltage applied is the voltage to be measured. It is not possible to measure instantaneous values of a fluctuating voltage because the measuring voltage must influence the converter for a certain interval of time.

The object of the invention is to perform the above mentioned method in such a way that instantaneous values can be measured.

This problem is solved in accordance with the present invention by measuring instantaneous values of the measurement voltage by first applying then measurement voltage and the applying a second voltage, the auxiliary voltage.

In this way it is possible to measure instantaneous values of voltages because the reference potential of the converter directly follows the first voltage. If certain instantaneous voltages of the first (fluctuating) voltage are to be measured, it is merely necessary to switch off the first voltage at that moment.

It should be mentioned that is already known (see German Patent Specification 2 111 393, FIG. 1 = U.S. Pat. No. 3,840,807, FIG. 1) in the case of an analogue-digital-converter comprising an integrator and a comparator, to feed in first the measuring voltage and then a further voltage. However, here contrary to the known analogue-digital-converter according to German Patent Specification 2 111 393, FIG. 3 (U.S. Pat. No. 3,840,807) there is not fed in previously an auxiliary voltage and therefore it is not possible to measure measurement voltages of different polarities. The further voltage is the voltage which discharges the voltage at the output of the integrator.

A further development of the invention is that the first voltage is applied over a diode, being positioned for example, in the feedback circuit coming from the comparator. In this way the peak voltage of a fluctuating voltage is registered.

With the aid of the following drawings the details of the invention are explained;

FIG. 1 a block diagram of an embodiment according to the invention

Figure 2:
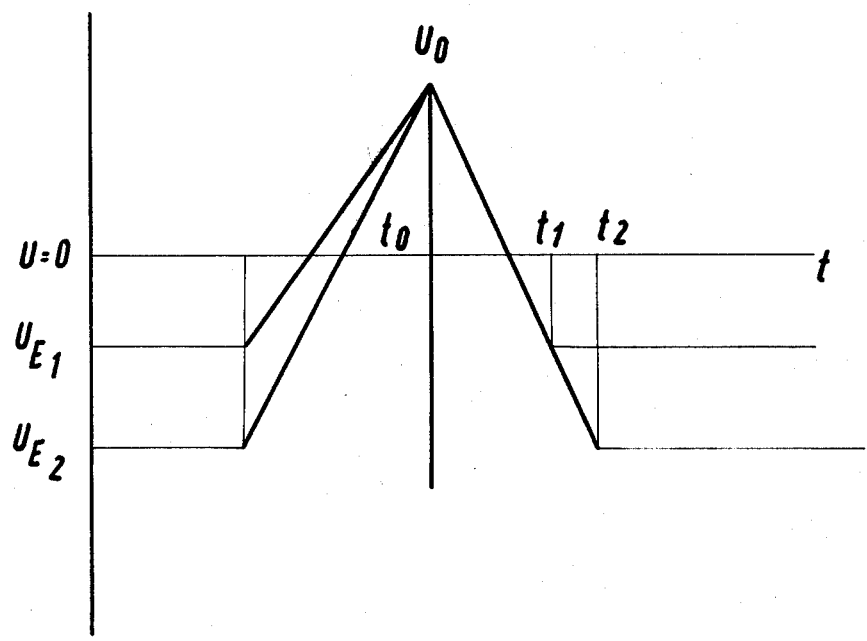

FIG. 2 the behaviour of the voltage with time at point A in FIG. 1.

In FIG. 1 a preamplifier in the form of a differential amplifier is indicated by 1, an integrator by 2, a comparator by 3, a capacitor by 4, a diode by 5 and switches by 6 to 10. All components are electrically connected as shown in FIG. 1.

The measurement is carried out as follows (see also FIG. 2):

With closed switches 6, 7 and 10 and open switches 8 and 9 the fluctuating measurement voltage $U_E$ is applied to the converter. The voltage at the capacitor 4, and thus the reference potential of the converter, follows $U_E$. If the switches 7 and 10 are opened the voltage existing at this very moment is at the capacitor 4. Now, by closing the switch 8 a certain voltage $U_o$ is applied to the converter. The result is that the voltage at point A of FIG. 1 rises to the value $U_o$. Then a certain voltage $U_R$ is applied to the converter by opening the switch 8 and closing the switch 9. This voltage is opposite to voltage $U_o$. The potential in point A discharges.

In FIG. 2 the beginning of the influence of this voltage $U_R$ is indicated by $t_o$. The time $t-t_o$ which lapses until the voltage in point A has reached the voltage $U_E$ is a measurement for the voltage $U_E$. $U_E$ can thus be measured.

If during the influence of the measurement voltage $U_E$ to the converter, i.e. at closed switches 7 and 10 and open switches 8 and 9, switch 6 is kept open, it is possible to measure with the converter peak voltages of a fluctuating voltage course $U_E$ because the diode 5 prevents a decline of the voltage at the capacitor 4 at falling $U_E$.

What is claimed is:

1. A method of measuring the instantaneous value of a fluctuating voltage, with the aid of an analogue-digital converter including an integrator, a comparator and a capacitor being located in a feedback circuit between the output of said comparator and the input of said converter, said method comprising the steps of applying the fluctuating voltage to the converter thereby causing the voltage across said capacitor to directly follow said fluctuating voltage, disconnecting said fluctuating voltage at the instant when its value is to be measured while disconnecting said feedback circuit between said comparator and said capacitor to retain a voltage thereon equal to the fluctuating voltage at said instant, applying a first known voltage to the converter for causing the voltage at the output of the integrator to rise to the value of said first known voltage, applying a second known voltage to the converter of polarity opposite to that of said first known voltage for causing the voltage at the output of the integrator to be reduced to the value of the voltage stored in said capacitor, measuring the time for said voltage at the output of said integrator to be reduced to the value of the voltage stored in said capacitor, and determining the value of said fluctuating voltage at said instant from said measurement.

2. A method of measuring the peak value of a fluctuating voltage using an analogue-digital converter including an integrator, a comparator, a diode and a capacitor, said capacitor and said diode being located in a feedback circuit between the output of said comparator and the input of said converter said method comprising the steps of applying the fluctuating voltage to be measured to the converter for causing the voltage appearing across said capacitor to become equal to the peak value of said fluctuating voltage, disconnecting said fluctuating voltage while disconnecting said feedback circuit for allowing said capacitor to retain a voltage thereon equal to said peak value of said fluctuating voltage, applying a first known voltage to the converter for causing the voltage at the output of the integrator to rise to the value of said first known voltage, applying a second known voltage to the converter of polarity opposite to that of said first known voltage for causing the voltage at the output of the integrator to be reduced to the value of said peak voltage stored in said capacitor, measuring the time for said voltage at the output of said integrator to be reduced to the value of the peak voltage stored in said capacitor, and determining the value of said peak voltage from said measurement.

3. A method as recited in claim 1 including the use of a preamplifier wherein said capacitor is located in a feedback circuit between the output of said comparator and the input of said preamplifier.

4. A method as recited in claim 2 including the use of a preamplifier wherein said capacitor is located in a feedback circuit between the output of said comparator and the input of said preamplifier.

* * * * *

UNITED STATES PATENT OFFICE
CERTIFICATE OF CORRECTION

Patent No. 4,144,492               Dated   March 13, 1979

Inventor(s)  Gero Zschimmer

It is certified that error appears in the above-identified patent and that said Letters Patent are hereby corrected as shown below:

Column 1, line 28:  Delete "then" and insert -- the --.

Column 1, line 29:  Delete "the" and insert -- then --.

Signed and Sealed this

Nineteenth Day of June 1979

[SEAL]

Attest:

RUTH C. MASON
*Attesting Officer*

DONALD W. BANNER
*Commissioner of Patents and Trademarks*